United States Patent
Simka et al.

(10) Patent No.: US 8,779,589 B2
(45) Date of Patent: Jul. 15, 2014

(54) LINER LAYERS FOR METAL INTERCONNECTS

(75) Inventors: Harsono S. Simka, Saratoga, CA (US); Daniel J. Zierath, Portland, OR (US); Michael G. Haverty, Mountain View, CA (US); Sadasivan Shankar, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 12/973,773

(22) Filed: Dec. 20, 2010

(65) Prior Publication Data
US 2012/0153478 A1 Jun. 21, 2012

(51) Int. Cl.
*H01L 23/52* (2006.01)
*H01L 21/48* (2006.01)
*H01L 21/768* (2006.01)
*H01L 23/532* (2006.01)
*H01L 21/44* (2006.01)

(52) U.S. Cl.
CPC .............. *H01L 23/53238* (2013.01); *H01L 21/76877* (2013.01)
USPC .............. 257/751; 257/E21.584; 257/E23.16; 438/650; 438/643

(58) Field of Classification Search
USPC ............ 257/762, 774, 751, E21.584, E23.16; 438/650, 643
See application file for complete search history.

(56) References Cited

U.S. PATENT DOCUMENTS

| | | | |
|---|---|---|---|
| 6,399,496 B1 | 6/2002 | Edelstein et al. | |
| 7,335,587 B2 | 2/2008 | Johnston | |
| 7,338,585 B2 | 3/2008 | Akolkar | |
| 7,341,946 B2 | 3/2008 | Kailasam | |
| 7,470,617 B2 | 12/2008 | Chebiam | |
| 7,476,615 B2 | 1/2009 | Han | |
| 7,629,252 B2 | 12/2009 | O'Brien | |
| 7,851,357 B2 | 12/2010 | Cabral, Jr. et al. | |
| 7,851,360 B2 | 12/2010 | Dominguez | |
| 7,867,891 B2 | 1/2011 | O'Brien | |
| 2003/0001266 A1* | 1/2003 | Hu | 257/758 |
| 2004/0157441 A1 | 8/2004 | Inoue et al. | |
| 2006/0027930 A1* | 2/2006 | Edelstein et al. | 257/762 |
| 2008/0045013 A1 | 2/2008 | Lavoie | |

(Continued)

FOREIGN PATENT DOCUMENTS

WO 2012/087578 A2 6/2012
WO 2012/087578 A3 8/2012

OTHER PUBLICATIONS

U.S. Appl. No. 12/890,462, entitled "Barrier Layers," filed Sep. 24, 2010.

(Continued)

*Primary Examiner* — Luan C Thai

(57) ABSTRACT

Electrical interconnects for integrated circuits and methods of fabrication of interconnects are provided. Devices are provided comprising copper interconnects having metallic liner layers comprising silver and a second component, such as, lanthanum, titanium, tungsten, zirconium, antimony, or calcium. Methods include providing a substrate having a trench or via formed therein, forming a silver alloy layer, comprising silver and a second component selected from the group consisting of lanthanum, titanium, tungsten, zirconium, antimony, and calcium, onto surfaces of the feature, depositing a copper seed layer, and depositing copper into the feature.

21 Claims, 4 Drawing Sheets

(56) References Cited

U.S. PATENT DOCUMENTS

| | | |
|---|---|---|
| 2008/0096381 A1 | 4/2008 | Han |
| 2008/0113508 A1 | 5/2008 | Akolkar |
| 2009/0022958 A1 | 1/2009 | Plombon |
| 2009/0169760 A1 | 7/2009 | Akolkar |
| 2010/0078820 A1 | 4/2010 | Kurokawa et al. |
| 2010/0200991 A1 | 8/2010 | Akolkar |
| 2010/0244252 A1 | 9/2010 | Jezewski |
| 2011/0147940 A1 | 6/2011 | Akolkar |

OTHER PUBLICATIONS

U.S. Appl. No. 12/978,175, entitled "Cobalt Metal Barrier Layers," filed Dec. 23, 2010.

International Search Report and Written Opinion Received for PCT Application No. PCT/US2011/063778, mailed on Jun. 28, 2012, 10 Pages.

International Preliminary Report on Patentability received for PCT Patent Application No. PCT/US2011/063778, mailed on Jul. 4, 2013, 7 pages.

* cited by examiner

LINER LAYERS FOR METAL INTERCONNECTS

BACKGROUND OF THE INVENTION

1. Field of the Invention

The embodiments of the present invention relate generally to semiconductor processing, integrated circuits, metal electrical interconnects, and liner layers for metal interconnects.

2. Background Information

The desire for ever-smaller integrated circuits (IC) places enormous performance demands on the materials used to construct IC devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example of 300 mm) and after processing the wafer is diced apart to create individual chips. A 1 $cm^2$ IC chip having feature sizes around of about 90 nm can comprise hundreds of millions of components. Current technologies are pushing feature sizes even smaller than 45 nm.

DETAILED DESCRIPTION OF THE INVENTION

Figure 1:
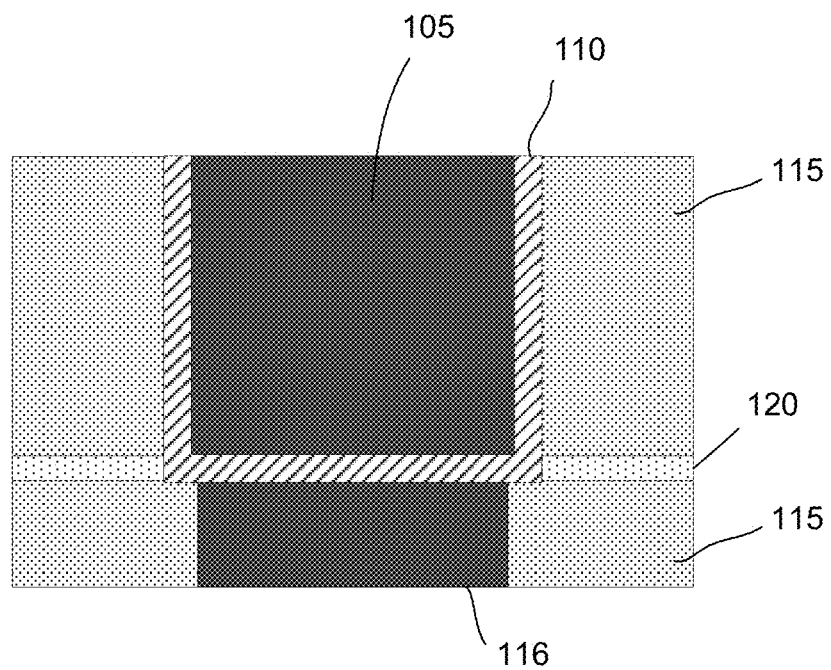
FIG. 1 shows an interconnect structure for an integrated circuit chip having liner layer between the metal interconnect and the other components (e.g., dielectric materials) that make up the integrated circuit chip.

Electronic connections between the electronic devices (e.g., transistors) in an integrated circuit (IC) chip are currently typically created using copper metal or alloys of copper metal. Devices in an IC chip can be placed not only across the surface of the IC chip but devices can also be stacked in a plurality of layers on the IC chip. Electrical interconnections between electronic devices that make up the IC chip are built using vias and trenches that are filled with conducting material. Layer(s) of insulating materials, frequently, low-k dielectric materials, separate the various components and devices in the IC chip.

The substrate on which the devices of the IC circuit chip are built is, for example, a silicon wafer or a silicon-on-insulator substrate. Silicon wafers are substrates that are typically used in the semiconductor processing industry, although embodiments of the invention are not dependent on the type of substrate used. The substrate could also be comprised of germanium, indium antimonide, lead telluride, indium arsenide, indium phosphide, gallium arsenide, gallium antimonide, and or other Group III-V materials either alone or in combination with silicon or silicon dioxide or other insulating materials. Devices that make up the IC chip are built on the substrate surface.

At least one dielectric layer is deposited on the substrate. Dielectric materials include, but are not limited to, silicon dioxide ($SiO_2$), low-k dielectrics, silicon nitrides, and or silicon oxynitrides. The dielectric layer optionally includes pores or other voids to further reduce its dielectric constant. Typically, low-k films are considered to be any film with a dielectric constant smaller than that of $SiO_2$ which has a dielectric constant of about 3.9. Low-k films having dielectric constants of about 3 to about 2.7 are typical of current semiconductor fabrication processes. The production of integrated circuit device structures often also includes placing a silicon dioxide ($SiO_2$) film or layer, or capping layer on the surface of low-k (low dielectric constant) ILD (inter-layer dielectric) films. Low-k films can be, for example, boron, phosphorous, or carbon doped silicon oxides. Carbon-doped silicon oxides can also be referred to as carbon-doped oxides (CDOs) and organo-silicate glasses (OSGs).

To form electrical interconnects, dielectric layers are patterned to create one or more trenches and or vias within which metal interconnects are formed. The terms trenches and vias are used herein because these are the terms commonly associated with the features that are used to form metal interconnects. In general, a feature used to form a metal interconnect is a depression having any shape formed in a substrate or layer deposited on the substrate. The feature is filled with conducting interconnect material. The trenches and or vias may be patterned (created) using conventional wet or dry etch semiconductor processing techniques. Dielectric materials are used to electrically isolate metal interconnects from the surrounding components. Liner layers are used between the metal interconnects and the dielectric materials to prevent metal (such as copper) migration into the surrounding materials. Device failure can occur, for example, in situations in which copper metal is in contact with dielectric materials because the copper metal can ionize and penetrate into the dielectric material. In addition, liner layers are placed between a dielectric material, silicon, and or other materials and the copper interconnect to promote adhesion of the copper to the other material(s). Delamination (due to poor adherence between materials) is also a difficulty encountered in the fabrication of IC chips that leads to device failure.

Embodiments of the invention provide layers of materials that act as liners between copper structures and dielectric layers. Advantageously, embodiments of the invention provide layers of material that exhibit a lower resistivity than conventional liner materials, such as, for example, tantalum (Ta), TaN, titanium (Ti), TiN, and WN. Embodiments of the invention do not require the use of conventional liner layers, such as, for example, TaN, TiN, and WN. Additionally due to improved wetting properties, embodiments of the invention enable the use of a thinner copper seed layer during copper deposition into vias and or trenches. Liner layer scaling enables complete gap fill in the vias and or trenches as feature dimensions shrink.

FIG. 1 provides an electrical interconnect structure having a layer of material that is capable of functioning as a liner layer. In FIG. 1, a metal via 105 (or trench) for an integrated circuit chip is separated from other components of the device by a liner layer 110 that lines the bottom and sides of the via 105 (or trench). The metal alloy layer 110 is located between dielectric layer 115 and the metal via 105 (or trench). The dielectric layer 115 can be, for example, what is frequently referred to as an interlayer dielectric layer (ILD). Additionally, in this embodiment, the device additionally features an etch stop layer 120 that resulted from the process used for device fabrication. An etch stop layer may be formed from a dielectric material, such as for example, silicon nitride, silicon oxynitride, and or silicon carbide. Optionally, the metal interconnect of FIG. 1, is in electrical communication with an additional metal interconnect structure 116 (a via or trench) and additional metal interconnect structures built above the via 105 (or trench) (not shown). The metal used for interconnects is, for example, copper, aluminum (Al), gold (Au), silver (Ag) and or alloys thereof. In some embodiments of the invention, the metal used for interconnects is copper or the metal is an alloy of copper.

In FIG. 1, the metal alloy layer 110 is comprised of a thin layer of silver metal alloy comprising silver and a second material, such as, lanthanum (La), titanium (Ti), tungsten (W), zirconium (Zr), antimony (Sb), or calcium (Ca). In alternate embodiments, the metal alloy layer 110 additionally comprises a third component, such as, for example, nitrogen (N), phosphorous (P), carbon (C), sulfur (S), silicon (Si), germanium (Ge), aluminum (Al), or boron (B). The metal alloy layer 110 is capable of blocking copper migration into the adjacent dielectric layers. The silver alloy layer 110 has a thickness of between one monolayer and 10 nm. In additional embodiments, the silver alloy layer 110 has a thickness of between 1 nm and 10 nm. The second material is present in the liner layer in an amount between 0.1 and 66 atomic mole percent of the silver. In additional embodiments the second material is present in the liner layer in an amount between 1 and 50 atomic mole percent of the silver. The optional third component is present in the liner layer in an amount between 0.1 and 66 atomic mole percent of the silver. In additional embodiments the third material is present in the liner layer in an amount between 1 and 50 atomic mole percent of the silver.

In additional embodiments, the device of FIG. 1 includes an additional layer (not shown) between the silver metal alloy layer 110 and the dielectric layer 115. The additional layer is a layer such as $RuP_x$ layer (where x is a number between and including 1 and 2), or other liner materials, such as, for example, tantalum, TaN, titanium, TiN, and WN. Due to the lower resistivity values for the metal alloy layer 110, this combination provides a reduction in resistance compared to conventional liner materials of the same thickness.

In embodiments of the invention, the second (and or third) material is not necessarily evenly distributed within the silver layer. For example, the second (and or third) alloy material may preferentially accumulate on the surfaces of the sides of the trench or via (e.g., on the surface of the dielectric material in which the trench or via is formed or on the surface of a layer between the silver alloy layer and the dielectric material).

Advantageously in embodiments of the invention, no tantalum or TaN adhesion layer is used with the silver alloy layer. The use of a liner layer comprised Ta, TaN, Ti, TiN, or WN in a metal interconnect structure increases the resistance of the interconnect structure as compared to interconnects that do not have a Ta, TaN, Ti, TiN, or WN liner layer. Additionally, in embodiments of the invention, during the formation of the interconnect structure, it is possible to use a relatively thin copper seed. The relaxed requirements for the copper seed layer thickness allow smaller features and features with higher aspect ratios to be formed using metal fill techniques such as electrodeposition (electroplating).

Figure 2A:
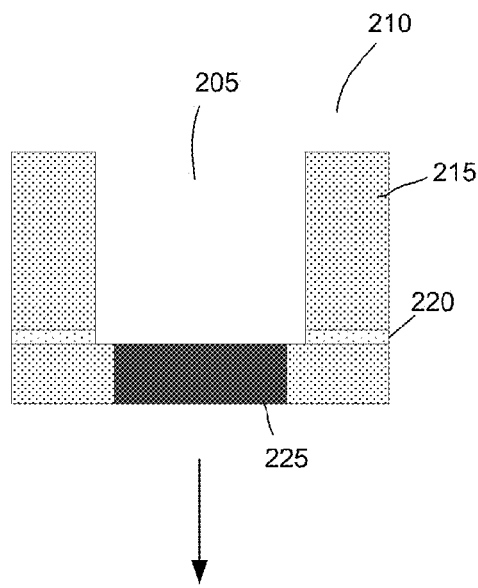
FIGS. 2A-E demonstrate a process for forming a liner layer useful in metal interconnect structures for integrated circuit chips.
Figure 2B:
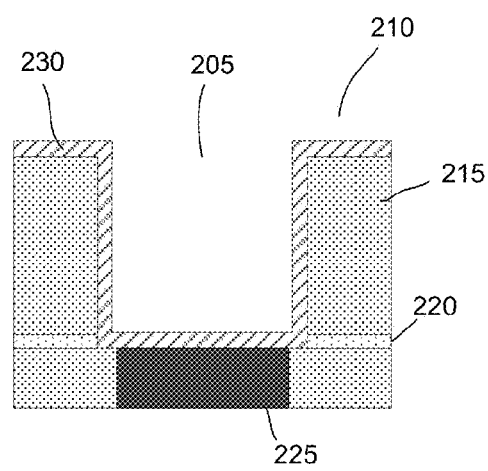

FIGS. 2A-E illustrate a process for creating a liner layer for metallic interconnect structures. In FIG. 2A a depression 205 (e.g., a via or trench, or gap) to be filled with a conducting material to create an electrical interconnect is provided in a substrate 210. The depression 205 is typical of the types of vias that are filled during back end metallization processes in which semiconductor devices (e.g., transistors, resistors, capacitors) are interconnected in an integrated circuit chip. The depression 205 is, for example, etched into a dielectric layer 215 (an ILD layer, for example). The dielectric layer material is, for example, silicon dioxide, low-k dielectrics, and or other dielectric materials. Layer 220 in FIG. 2 is an etch stop layer created during device fabrication. Metallic structure 225 is an electrical device interconnect and is comprised of a conducting metal, such as, for example, copper metal and alloys of copper metal. A thin silver alloy layer 230 is deposited by atomic layer deposition (ALD), chemical vapor deposition (CVD), or physical vapor deposition (PVD), for example, and the structure of FIG. 2B is obtained. Depending on the alloy material, the thin silver alloy layer 230 can also be deposited by electroless deposition or electroplating. The thin silver alloy layer 230 is comprised of an alloy of silver metal with a second material such as, for example, lanthanum, titanium, tungsten, zirconium, antimony, or calcium. In alternate embodiments, the metal alloy layer 230 additionally comprises a third component, such as, for example, nitrogen, phosphorous, carbon, sulfur, silicon, germanium, aluminum, or boron. In embodiments of the invention, the thin silver alloy layer 230 is deposited in a single deposition from a precursor comprising the components of the layer. In alternate embodiments, the thin metal alloy layer 230 is deposited as layers of different materials that become combined, for example, upon annealing. The silver alloy layer 110 has a thickness of between 1 monolayer and 10 nm. In additional embodiments, the silver alloy layer 110 has a thickness of between 1 nm and 10 nm.

Figure 2C:
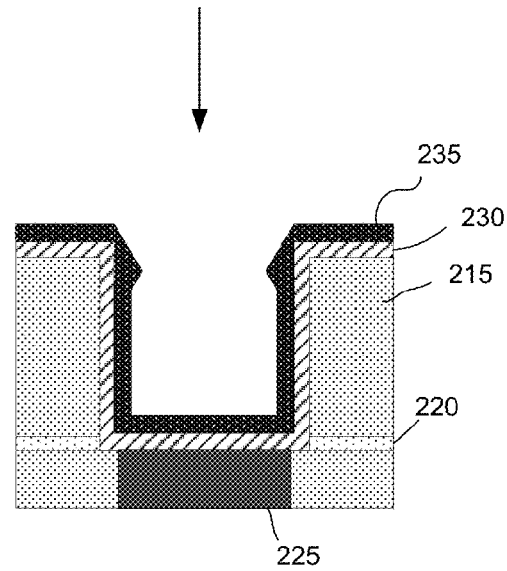

A copper seed layer 235 is deposited onto the structure of FIG. 2B, and the structure of FIG. 2C is obtained. In alternate embodiments, the copper seed layer comprises a dopant. Optionally, the dopant is, for example, an alloy component, such as, lanthanum, titanium, tungsten, zirconium, antimony, or calcium. In this embodiment, in which the copper seed layer contains a dopant, the layer 230 is optionally a silver metal layer. In further alternate embodiments, a dopant in the copper seed layer is a third component of the metal alloy layer, such as, for example, nitrogen, phosphorous, carbon, sulfur, silicon, germanium, aluminum, or boron. Upon annealing of the structure, dopant in the copper seed layer migrates into the silver layer forming an alloy or mixture. The optional dopant is present in the copper seed layer 235 in an amount of 0.1 to 20 atomic mole percentage (at. %) of the seed layer. The seed layer is deposited, for example, by PVD, CVD, electrodeposition, or ALD. Optionally, the seed layer is a thin layer having a thickness of between 1 monolayer and 10 nm. In additional embodiments the seed layer has a thickness of between 1 nm and 10 nm.

Figure 2D:
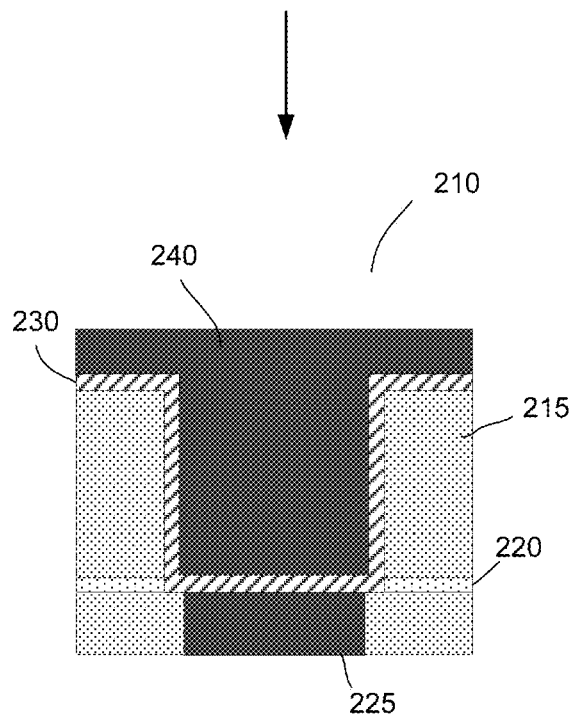
Figure 2E:
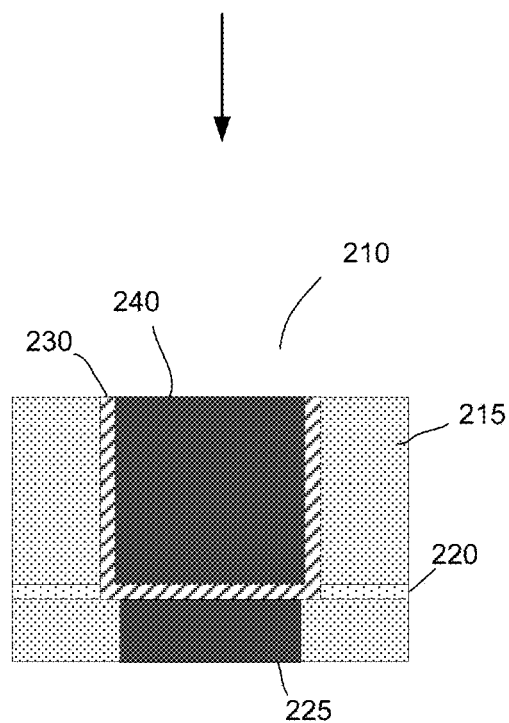

The copper interconnect 240 material (or other conducting material) is then electrodeposited and the structure is annealed providing the device of FIG. 2D Annealing is accomplished, for example, by heating the structure to 250-400° C. for two hours. Other temperatures and time periods for annealing are also possible. A chemical mechanical polish process planarizes the top of the copper interconnect 240 to the top of the dielectric layer 215 forming the structure of FIG. 2E. Further interconnect layers (not shown), for example, are then built on structure of FIG. 2E to forming a completed IC device.

Figure 3:
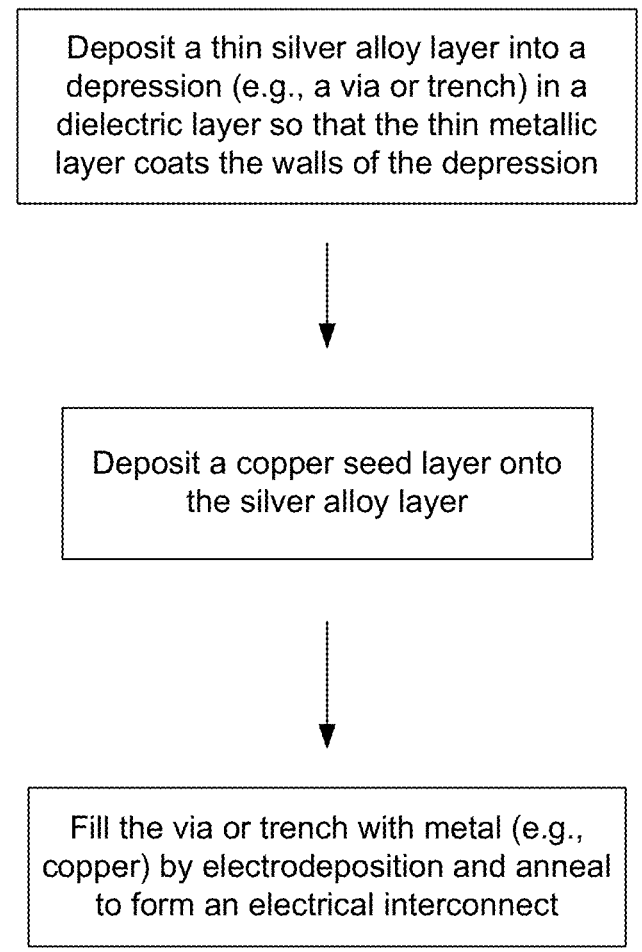
FIG. 3 describes a process for forming a liner layer useful in metal interconnect structures for integrated circuit chips.

FIG. 3 describes a process for forming liner layers for back end metallization, e.g., forming copper interconnects for transistor devices for integrated circuit chips. In FIG. 3, a trench or via that is to be filled with a conducting metal to form an electrically conducting interconnect is provided. The trench or via is a depression that is typically formed in a dielectric layer, such as an ILD layer through an etching process used in the semiconductor industry. The walls and bottom of the trench or via (the side(s) of the depression) are coated with a thin silver alloy layer. The thin silver alloy layer is comprised of an alloy of silver metal with a second material such as, for example, lanthanum, titanium, tungsten, zirconium, antimony, or calcium. In alternate embodiments, the metal alloy layer 230 additionally comprises a third component, such as, for example, nitrogen, phosphorous, carbon, sulfur, silicon, germanium, aluminum, or boron. The thin metallic alloy layer is deposited by ALD, CVD, or PVD, for example. The copper seed layer is then deposited. The copper seed layer is deposited by ALD, PVD, electrodeposition, or CVD, for example. In embodiments of the invention, the copper seed layer has an thickness of 1 monolayer to 10 nm. In additional embodiments the seed layer has a thickness of between 1 nm and 10 nm. The trench or via is then filled with metal through an electrodeposition process (electrochemical plating). Annealing the structure provides a electrical interconnect structure having a liner layer that prevents the migration of metal interconnect material into surrounding materials. Typically, further processing includes chemical mechanical polishing that planarizes the interconnect and the interlayer dielectric material so that both are of essentially equal height.

In alternate embodiments the copper seed layer comprises a dopant. The dopant can be the second material such as, for example, lanthanum, titanium, tungsten, zirconium, antimony, or calcium that migrates and forms an alloy with the silver upon annealing. In alternate embodiments in which the silver alloy layer comprises a third component, the dopant is optionally the third component, such as, for example, nitrogen, phosphorous, carbon, sulfur, or boron. Similarly, the third component migrates and forms an alloy with the silver upon annealing.

In general, an electrodeposition process comprises the deposition of a metal onto a semiconductor substrate from an electrolytic solution that comprises ions of the metal to be deposited. A negative bias is placed on the substrate. The electrolyte solution can be referred to as a plating bath or an electroplating bath. The positive ions of the metal are attracted to the negatively biased substrate. The negatively biased substrate reduces the ions and the metal deposits onto the substrate.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and or structures may be included and or described features may be omitted in other embodiments.

We claim:

1. A device comprising;
   a substrate comprising a layer of dielectric material, the layer of dielectric material comprising a depression formed therein,
   a metal alloy layer wherein the depression has at least one side and the layer of dielectric material comprising the side of the depression is in direct contact with the metal alloy layer, wherein the metal alloy layer is comprised of silver and a second component selected from the group consisting of lanthanum, titanium, tungsten, zirconium, antimony, and calcium, and
   a copper layer in the depression wherein the metal alloy layer is between the copper and the layer of dielectric material, and wherein the metal alloy layer is in direct contact with the copper layer in the depression.

2. The device of claim 1 wherein the second component is present in the metal alloy layer in an amount from 1 to 50 atomic mole percent.

3. The device of claim 1 wherein the depression does not have a layer comprising Ta, the depression does not have a layer comprising TaN, the depression does not have a layer comprising TiN, and the depression does not have a layer comprising W.

4. The device of claim 1 wherein the metal alloy layer is between 1 nm and 10 nm thick.

5. The device of claim 1 wherein the metal alloy layer additionally comprises a third component selected from the group consisting of nitrogen, phosphorous, carbon, sulfur, silicon, germanium, aluminum, or boron.

6. The device of claim 1 wherein the depression is a trench or via.

7. The device of claim 1 wherein the second component is not evenly distributed throughout the metal alloy layer.

8. A method comprising,
   providing a substrate wherein the substrate comprises a dielectric layer, wherein there is a depression in the dielectric layer, and wherein the depression has at least one surface,
   depositing a metal alloy layer, wherein the metal alloy layer is comprised of silver and a second component selected from the group consisting of lanthanum, titanium, tungsten, antimony, and calcium, directly onto the depression in the dielectric layer,
   depositing a copper seed layer onto the metal alloy layer, and
   depositing copper into the depression.

9. The method of claim 1 wherein the second component is present in the metal alloy layer in an amount from 1 to 50 atomic mole percent.

10. The method of claim 8 wherein the copper is deposited into the depression by electrodeposition.

11. The method of claim 8 where annealing occurs after copper seed layer deposition or after deposition of the copper into the depression.

12. The method of claim 8 wherein a copper-filled depression resulting from the method of claim 1 does not have a layer comprising Ta, does not have a layer comprising TaN, does not have a layer comprising TiN, and does not have a layer comprising W.

13. The method of claim 8 wherein the depression is a trench or a via.

14. The method of claim 8 wherein the metal alloy layer additionally comprises a third component selected from the group consisting of nitrogen, phosphorous, carbon, sulfur, silicon, germanium, aluminum, or boron.

15. A device comprising;
   a substrate comprising a layer of dielectric material,
   the layer of dielectric material comprising a depression formed therein,
   a metal alloy layer wherein the depression has at least one side and the side of the depression is in direct contact with the metal alloy layer, wherein the metal alloy layer is comprised of silver and a second component selected from the group consisting of lanthanum, titanium, tungsten, antimony, and calcium, and
   a copper layer in the depression is wherein the metal alloy layer is between the copper layer and the layer of dielectric material and the metal alloy layer is in direct contact with the copper layer.

16. The device of claim 15 wherein the second component is present in the metal alloy layer in an amount from 1 to 50 atomic mole percent.

17. The device of claim 15 wherein the depression does not have a layer comprising Ta, the depression does not have a layer comprising TaN, the depression does not have a layer comprising TiN, and the depression does not have a layer comprising W.

18. The device of claim 15 wherein the metal alloy layer is between 1 nm and 10 nm thick.

19. The device of claim 15 wherein the metal alloy layer additionally comprises a third component selected from the group consisting of nitrogen, phosphorous, carbon, sulfur, silicon, germanium, aluminum, or boron.

20. The device of claim 15 wherein the depression is a trench or via.

21. The device of claim 15 wherein the second component is not evenly distributed throughout the metal alloy layer.

* * * * *